United States Patent [19]
Ohkase

[11] Patent Number: 5,520,742
[45] Date of Patent: May 28, 1996

[54] THERMAL PROCESSING APPARATUS WITH HEAT SHIELDING MEMBER

[75] Inventor: Wataru Ohkase, Sagamihara, Japan

[73] Assignees: Tokyo Electron Kabushiki Kaisha, Tokyo; Tokyo Electron Tohoku Kabushiki Kaisha, Iwate, both of Japan

[*] Notice: The term of this patent shall not extend beyond the expiration date of Pat. No. 5,443,648.

[21] Appl. No.: 203,922

[22] Filed: Mar. 1, 1994

[30] Foreign Application Priority Data

Mar. 3, 1993 [JP] Japan .................................. 5-069375

[51] Int. Cl.$^6$ .................................................. C23C 16/00
[52] U.S. Cl. ........................ 118/724; 118/725; 118/729; 118/730; 432/241
[58] Field of Search .................................. 118/725, 724, 118/729, 730; 432/241

[56] References Cited

U.S. PATENT DOCUMENTS

| | | | |
|---|---|---|---|
| 4,745,088 | 5/1988 | Inoue | 437/102 |
| 4,857,689 | 8/1989 | Lee | 219/10.71 |
| 4,989,540 | 2/1991 | Fuse | 118/719 |
| 5,001,327 | 3/1991 | Hirasawa | 219/390 |
| 5,029,554 | 7/1991 | Miyashita | 118/715 |
| 5,125,360 | 6/1992 | Nakayama | 118/730 |
| 5,127,365 | 7/1992 | Koyama | 118/724 |
| 5,146,869 | 9/1992 | Bohannon | 118/724 |
| 5,148,714 | 9/1992 | McDiarmid | 74/89.15 |
| 5,217,560 | 6/1993 | Kurono | 156/345 |
| 5,227,579 | 1/1994 | Takanabe | 432/5 |
| 5,279,670 | 1/1994 | Watanabe | 118/725 |
| 5,303,671 | 4/1994 | Kondo | 118/719 |
| 5,320,680 | 6/1994 | Learn | 118/724 |
| 5,329,095 | 7/1994 | Okase | 219/390 |
| 5,387,265 | 2/1995 | Kakizaki | 29/25.01 |

FOREIGN PATENT DOCUMENTS

63-232422  9/1988  Japan .
2-216820  6/1990  Japan .

Primary Examiner—R. Bruce Breneman
Assistant Examiner—Jeffrie R. Lund
Attorney, Agent, or Firm—Beveridge, DeGrandi, Weilacher & Young

[57] ABSTRACT

A heat shielding member is provided on an object-to-be-processed holder for loading/unloading an object to be processed to/from a thermal processing position. The heat shielding member can cover a space below the processing position. As a result, leakage of radiation heat from the processing position can be blocked, and an optimum temperature gradient at the processing position can be maintained. Accordingly the entire surface of the object to be processed can be efficiently thermally processed at uniform temperatures, and throughputs in the fabrication steps can be improved.

24 Claims, 7 Drawing Sheets

THERMAL PROCESSING APPARATUS WITH HEAT SHIELDING MEMBER

BACKGROUND OF THE INVENTION

The present invention relates to a thermal processing apparatus for thermally processing an object to be processed in a vertical process tube.

In the fabrication of, e.g., semiconductor wafers, LCD substrate, etc. there are various thermal processing apparatuses for processing, such as oxidation, diffusion, annealing, CVD, etc. Technical problems with such thermal processing apparatuses require work towards the e.g., achievement of higher precision of processes, improvement of uniform temperature distribution in the same plane of an object to be processed, improvement of thermal processing efficiency, etc.

Recently semiconductor processes have been further micronized while the diameters of wafers, an object to be processed, have been increased from 8 inches to 12 inches. In addition, thermal processing apparatuses for homogeneously and efficiently processing large substrates, such as LCD substrates, etc. are needed. In accordance with increasing micronization of the processes and increased diameters of the object to be processed, higher precision of the processing, more uniform temperature distribution in the same plane of the object to be processed, and improved thermal processing efficiency are required. In addition, improved throughputs of the fabrication of the object-to-be-processed, whose diameters tend to be increased, are required.

Accompanying the increase of diameters of the object to be processed, the following problems are involved in the actual thermal processing.

That is, it is necessary to efficiently prevent slip and distortion of the object to be processed and improve uniformity of temperature distributions in the same plane of the object to be processed. To these ends, serious technical problems exist such as how to homogeneously heat the object to be processed, how to minimize temperature differences of the object to be processed between the central parts and the peripheral parts, which are caused by larger heat dissipation amounts of the peripheral parts than those of the central parts, and so on. It is necessary that, in accordance with the micronization of the processes the heat processing on the object to be processed be of higher precision, and contamination of the object to be processed be decreased. Accordingly technical problems that exist include how to conduct the thermal processing efficiently for short periods of time for homogeneous film quality and thicknesses in the same plane of the objects to be processed, how to decrease damage to the object to be processed by contamination due to heavy metals, etc., and so on.

SUMMARY OF THE INVENTION

In view of the above-described problems, the present invention has been made, and the object of the present invention is, to provide a thermal processing apparatus which can thermally process the entire surfaces of the object to be processed efficiently at uniform temperatures, and can improve throughputs of the thermal processing steps.

To solve the above-described problems, the thermal processing apparatus according to the present invention comprises a vertical process tube having an opening for loading/unloading an object to be processed in the bottom, and a heat source disposed above the same for heating the object to be processed; an object-to-be-processed holder for holding one sheet of object to be processed in a horizontal orientation to load the same into the process tube through the bottom opening and to set the same at a prescribed processing position; gas feed means for feeding reaction gas to the prescribed processing position in the process tube; and a first heat shielding member for blocking heat from the process tube disposed on the holder for covering the process tube below the prescribed processing position when the holder is set at the prescribed processing position.

The thermal processing apparatus according to the present invention comprises an air-tight chamber provided below the bottom opening of the process tube, heat shielding shutters that are capable of being opened and closed in the air-tight chamber along the vertical axis thereof; a second heat shielding member in addition to said first heat shielding member is provided integral on the holder, and when the holder is in the prescribed processing position, the first heat shielding member is above that of the heat shielding shutters which is nearer to the bottom opening.

The thermal processing apparatus according to the present invention is characterized in that in the air-tight chamber there is provided a cooling member which is opposed to the holder which has been retreated downward from the prescribed processing position to cool the processed object.

The thermal processing apparatus according to the present invention is characterized in that the cooling member is provided with nozzles which are disposed on the inside of the wall of the air-tight chamber for injecting cooling gas.

The thermal processing apparatus according to the present invention is characterized in that the cooling member is provided by a water cooling jacket disposed inside the heat shielding shutter which is opposed to the surface of the processed object.

According to the present invention, heat radiation from the peripheral part of the object to be processed is suppressed to make no temperature differences in plane, whereby homogeneity in plane is ensured. That is, the heat shielding member is disposed on the holder for holding the object to be processed in a horizontal orientation below the processing position and above the lower part. Accordingly the heat shielding member functions as a heat shielding member for a part between the processing position and the lower part to prevent changes of a temperature gradient at the processing position. By preventing changes of a temperature gradient generation of gas streams can be prevented, and heat radiation from the peripheral part of the object-to-be-processed due to generated air streams can be suppressed. Accordingly homogeneity in one place of the object to be processed can be well maintained. According to the present invention, when an object to be processed is loaded/unloaded, the holder is rotated until the holder arrives at the processing position. Accordingly even when radiation heat components are deflected, the object to be processed is rotated, so that homogeneous radiation heat is applied in one plane. Furthermore, when the processed object is unloaded, the heat shielding member is displaced from below the processing position before the processed object is unloaded, so that gas streams are generated around the heat shielding member, and the generation of gas streams at the peripheral part of the object to be processed can be prevented with the part where the air streams have been generated, as a buffer.

In addition, according to the present invention, reaction gas to be fed into the processing position in the process tube can be preheated. By raising a temperature of the reaction gas beforehand, a period of time in which the reaction gas reaches a reaction temperature can be reduced.

Furthermore, the preheated part functions as a soaking part at the processing position, so that the part can be set at a temperature gradient required between the processed surface of the object to be processed.

The present invention comprises a cooling member which, when the holder is retreated from the processing position, cools the processed object. Accordingly the processed object can be cooled when the processed object is unloaded. Higher throughputs for the fabrication step including the displacement of the object to be processed.

DETAILED DESCRIPTION OF THE PREFERRED EMBODIMENTS

The present invention will be explained in good detail by means of embodiments of FIGS. 1 to 14.

Figure 1:
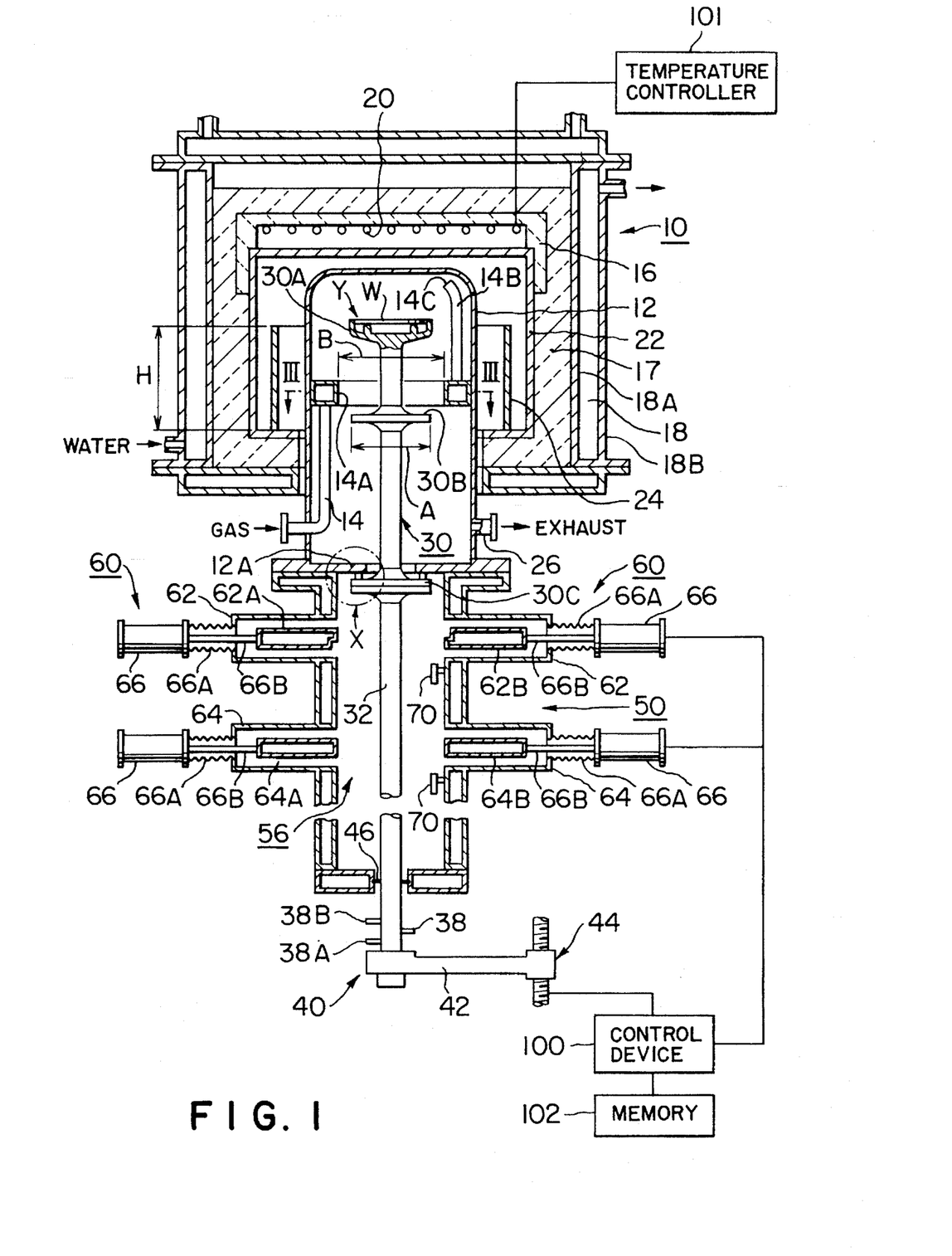
FIG. 1 is a vertical sectional view of the thermal processing apparatus according to one embodiment of the present invention to show the general structure thereof.

FIG. 1 is a vertical sectional view of an embodiment of the thermal processing apparatus according to the present invention, which show the general structure thereof.

The thermal processing apparatus according to this embodiment mainly includes a thermal processing unit 10, an object-to-be-processed loading/unloading unit 50, and a shutter drive unit 60.

The thermal processing unit 10 conducts various thermal processing on a sheet of object to be processed W, such as a semiconductor wafer, an LCD or others and includes a vertical process tube 12 at the center. The process tube 12 is a cylindrical member having the lower end opened. In this embodiment, the process tube is formed of aluminium for light weight. The process tube 12 has a portion of the inside surface made heat resistant with, e.g., alumina ($Al_3O_2$) to be opposed to a region of the object W that is to be thermally processed.

Figure 2:
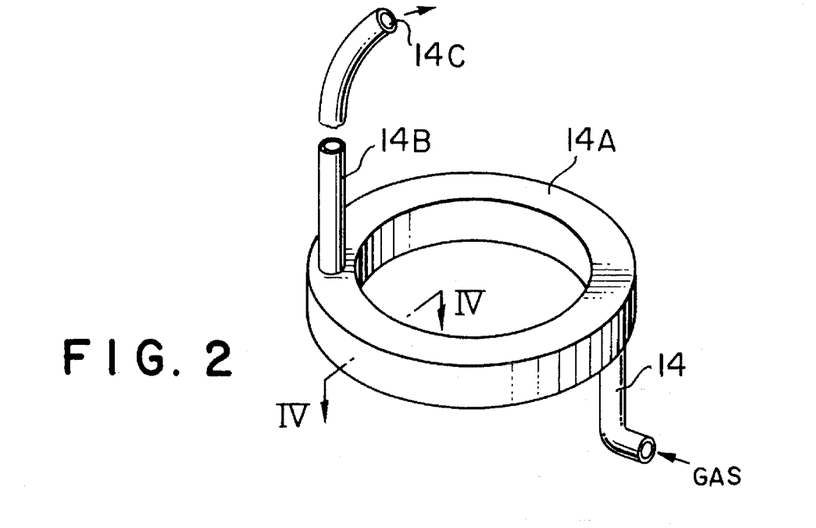
FIG. 2 is a perspective view of the gas feed pipe of the thermal processing apparatus of FIG. 1.

A gas feed pipe 14 which supplies process gas from the outside is disposed in the process tube 12. The gas feed pipe 14 has a opening 14C in the upper end of an upper end portion 14B thereof which opens in the interior space of the process tube 12, and has a preheating portion 14A in the form of a number with an annular void as shown in FIG. 2 on the way to the opening 14C, i.e., below the thermal processing position of the object to be processed W.

The preheating portion 14A absorbs atmospheric heat below the thermal processing position of the object to be processed W to heat the process gas supplied into the process tube 12 from the outside, and temporarily stores the same to eject the same into the space of the interior of the process tube 12 at the upper part of the thermal processing unit 10. Thus the process gas is heated proximate to a processing temperature of the object to be processed W until the process gas is ejected into the process tube 12. A period of time in which the process gas reaches a reaction temperature can be greatly reduced.

Figure 3:
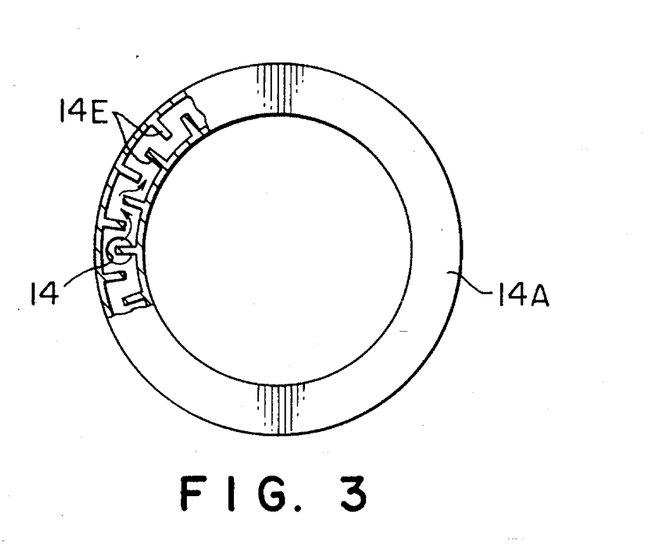
FIG. 3 is a sectional view of the gas feed pipe of the thermal processing apparatus of FIG. 1 along the line III—III.
Figure 4:
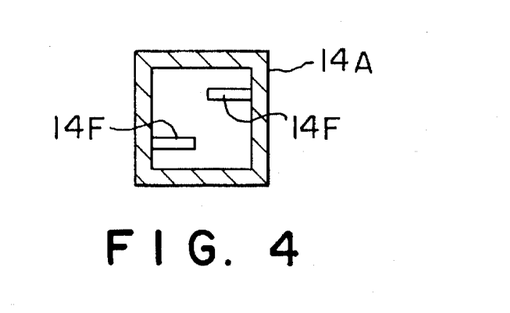
FIG. 4 is a sectional view of the gas feed pipe of FIG. 2 along the line IV—IV and shows the gas feed pipe with baffle plates of different shape from those of FIG. 3 disposed inside.

The absorption of the atmospheric heat by the preheating portion 14A places a lower space below a position corresponding to the underside of the processed surface Y of the object to be processed W at a temperature which provides a temperature gradient between the treated surface Y of the object to be processed W and the lower space so as to establish homogeneity in the plane of the object to be processed W. It is possible to provide a plurality of heat radiation fins 14E alternately at a set interval along the circumference as shown in FIG. 3 in the inside void of the preheat portion 14A of the gas feed pipe 14. This enables heat from the thermal processing unit 10 to be efficiently radiated to the process gas. It is also possible to provide heat radiation fins 14E alternately length-wise as shown by reference number 14F in FIG. 4.

As shown in FIG. 1, an exhaust pipe 26 which discharges the process gas supplied through the gas feed pipe 14 is provided in the process tube 12 near the opening in the lower end. The combination of these pipes causes the process gas fed into the process tube 12 to flow suitably to homogenize thin films formed on the surface of the object to be treated W, etc. the surfaces of the gas feed pipe 14 and the exhaust pipe 28 are covered with, e.g., quartz or others against heavy metal contamination.

A cylindrical insulating member 16 of, e.g., alumina ceramics or others, is disposed around the process tube 12.

The heat insulating member 16 is disposed inside a heat insulating member 17 of glass wool or asbestos disposed around the heat insulating member 16.

On the exterior of the heat insulating member 17 there is provided a water cooling mechanism 18 comprising a cylindrical inner shell 18A and outer shell 18B. Water is supplied into the water cooling mechanism to thermally isolate the thermal processing unit 10 from the outside. This thermal isolation secures safe operation outside when a high temperature thermal processing is conducted in the thermal processing unit 10.

As shown in FIG. 1, a heat source plate 20 is provided above the process tube 12, and its heat temperature is controlled by a temperature controller 101. The heat source plate 20 is provided by a resistance heating body, such as wires of molybdenum disilicide ($MoSi_2$), of KANTAL (trademark), an alloy of iron (Fe), chrome (Cr) and aluminium (Al), or of others, disposed on the inside of the upper surface of the heat insulating member 16. Especially molybdenum disilicide, which is sufficiently durable to a high temperature of 1800° C., is suitable as the oxidation diffusing material. It is possible that the heat source plate 20 is provided by, e.g., a spiral of a resistance heat wire formed of a molybdenum disilicate single wire. It is efficient in terms of heat efficiency that the heating surface of the heat source plate 20 has a diameter more than twice an outer diameter of the object to be processed W.

A soaking member 22 is provided between the process tube 12 and the heat source plate 20 for applying heat from the heat source plate 20 to the object to be processed W. The soaking member 22 is formed of, e.g., a material which is relatively less contaminated with silicon carbonate (SiC) or others and has good heat resistance, and is disposed over the region between the upper surface of the process tube 12 and the heat source plate 20 and the region surrounding the circumferential surface of the process tube 12. Even when disuniform heating occurs in the heat source plate 20, the soaking member 22 removes the disuniform heating to homogenize a temperature distribution for the thermal processing of the object to be processed W.

Generally a heat dissipation amount tends to be larger at the peripheral part of the object to be processed W in the same plane thereof, than the central part thereof. This tends to make a temperature distribution in one plane disuniform. The soaking member 22 is opposed to the peripheral part of the object to be processed W, whereby the heat dissipation from the peripheral part can be effectively prevented with a result of improved homogeneous thermal processing characteristics. The use of a material, such as silicon carbonate or others, having good heat resistance and less contamination can thermally isolate the processing space of the process tube 12 from the heat source. Even in the case that the heat source is formed of a material containing heavy metals, which are a cause of the contamination, the contamination by the heavy metals can be sufficiently prevented.

Figure 5:
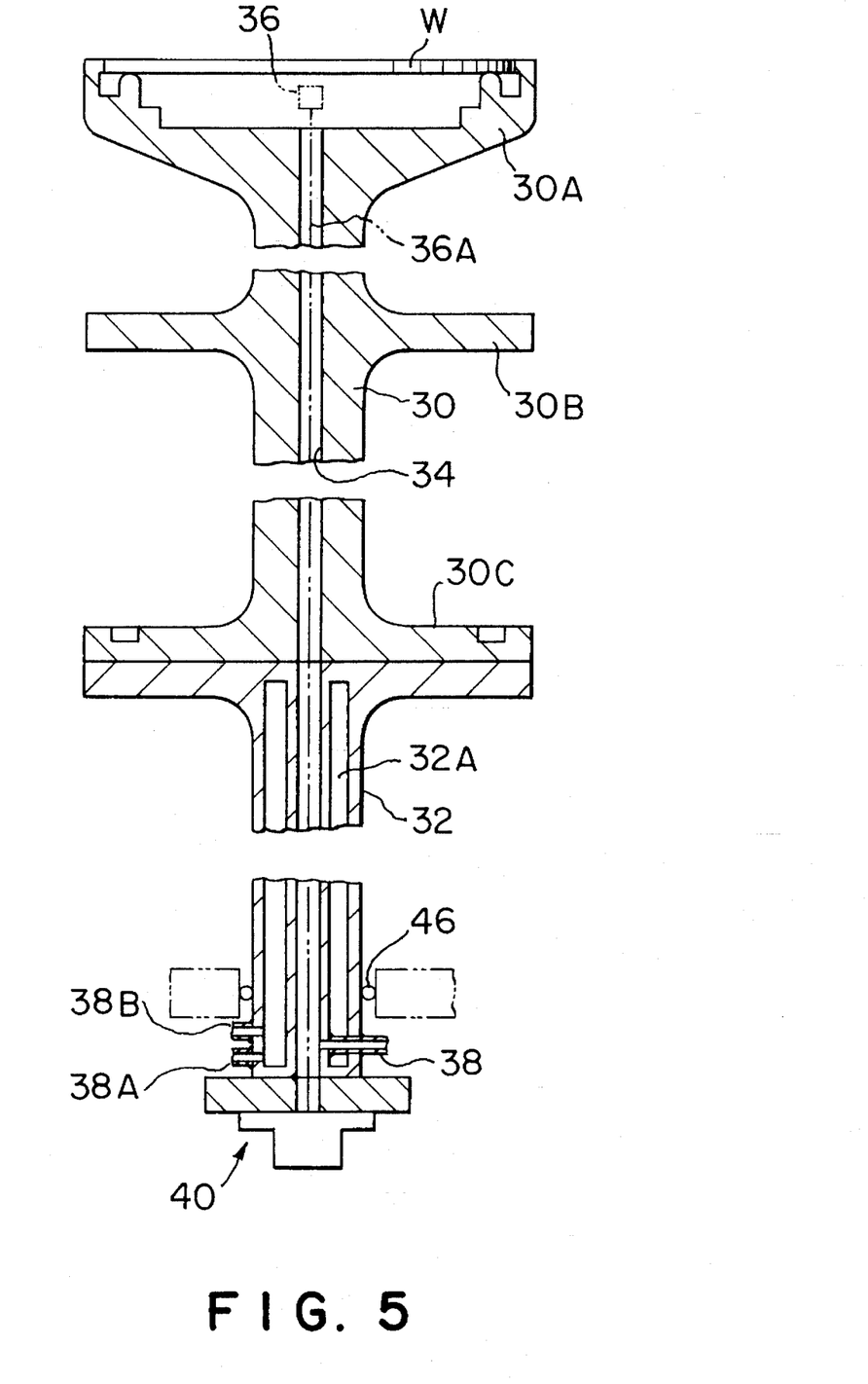
FIG. 5 is a vertical sectional view of the object-to-be-processed holder of the thermal processing apparatus of FIG. 1.

In the thermal processing apparatus according to this embodiment, a cylindrical heat insulating member 24 for shielding radiation heat from the soaking member 22 is disposed in a space defined by the soaking member 22 and between the process tube 12 and the same. The heat insulating member 24 is provided by a heat shielding wall formed of a material, such as aluminium oxide ($Al_2O_3$), silicon dioxide ($SiO_2$) or others. The heat insulating member 24 has an adjustable height (H) which can surround a lower space below a set processing position of the object to be processed W when the object to be processed W is placed at the set position. The heat insulating member 24 shields radiation heat from the soaking member 22 so as to maintain a temperature gradient at the processing position of the object to be processed W. The above-described thermal processing unit 10 has a holder for the object to be processed W which transfers the object to be processed W into the thermal processing unit 10. The holder 30 for the object to be thermally processed is formed of quartz, and includes a mount 30A for the object to be processed to be mounted on which is in one-piece with the holder 30, and a shielding member 30B. The mount 30A is formed on the axially upper end of the holder 30 in a shape which can horizontally mount one sheet of object to be processed. The shielding member 30B shields radiation heat from the thermal processing unit 10, seals the process gas in the thermal processing unit 10, and rectifies gas streams when the holder 30 is displaced. The second shielding member 30B is in the form of a plug which is formed on a part of the holder below the mount 30A and has the upper surface and the underside streamlined. As shown in FIG. 5, the mount 30A and both heat shielding members 30B, 30C can be formed as a single, integral unit of common material.

As shown in FIG. 1, the shielding member 30B is provided at a position in the axial direction of the holder 30 so as to substantially plug the peripheral inner space of the preheating portion 14A of the processing unit 10 when the mount 30A is set at the processing position for the object to be processed W. The shielding member 30B has an outer diameter (A) which, when the mount 30A is displaced from the processing position for loading/unloading the object to be processed W, defines a gap which does not cause the gas present between the preheating unit 14A of the gas feed pipe 14 and the same to abruptly flow. In this embodiment the outer diameter (A) is set to be smaller than an inner diameter (B) of the inside wall of the preheating unit 14A by about 30 mm.

This is, e.g., the diameter is designed to prevent temperature differences in the plane of the object to be processed W when the holder 30 is displaced downward from the thermal processing unit 10 after the thermal processing of the object to be processed W. That is, when neighboring members, such as the preheating unit 14A and the shielding member 30B, are displaced relatively to each other, gas present therebetween is caused to flow in streams. A velocity of the streams is influenced by a size of the gap therebetween; when the gap is too small, a velocity abruptly gains acceleration, and convections are generated at the processing position in the process tube 12, which is the other space across the shielding member 30B.

Consequently heat dissipation from the peripheral part of the object to be processed W is adversely advanced. Here an outer diameter of the shielding member 30B is suitably determined so that a temperature gradient undergoes no changes, and increases in a gas stream velocity is suppressed when the object to be processed W is displaced to be unloaded from the process tube 12 so as to prevent the occurrence of temperature differences in one plane of the object to be processed. Accordingly even when streams of the gas of some velocity are caused around the shielding member 30B when the object to be processed W is displaced downward to be unloaded, the velocity is caused to act at the processing position, i.e., convections at the processing position are prevented and temperature changes in one plane of the object to be processed can be prohibited. The shape of the shielding member 30B is not limited to the plug body described above but, needless to say, must be set so as to prevent turbulences and streams of the gas For example, the shielding member 30B may have an (streamlined) shape of an up-and-down combination of cones, or a plurality of the shielding members 30B may be provided continuously above and below.

Another shielding member 30C is provided on the lower end of the holder 30. The shielding member 30C is provided by a flange. The flange is fastened to the flange of a cooling rod 32 provided below the lower end by bolts or others. The shielding member 30C covers the periphery of the opening in the bottom of the process tube 12 when the holder 30 is lifted with the mount 30A set at the processing position of the object to be processed W in the thermal processing unit 10, so as to block passage of the radiation heat through the loading/unloading unit 50, which will be explained later.

The cooling rod 32 is for cooling the holder 30. The cooling rod 32 is formed of metal (SUS) or quartz, and as shown in FIG. 5, has a water jacket 32A formed therein. Cooling water is fed and discharged respectively at a cooling water feed port 38A and a cooling water discharge port 38B.

As shown in FIG. 5, a through-hole 34 which reaches the mount 30A is formed through the center of the holder 30 and the cooling rod 32. In the through-hole 34 there is inserted a lead wire 36A of a thermometer 36 for approximately measuring processing temperatures in the thermal processing unit 10. The thermometer 36 is provided on the underside of the mount 30A to sense surface temperatures of the object to be processed W. It is possible to use the through-hole 34, in place of the thermometer, as, e.g., an optical path to an optical temperature sensor for sensing temperatures based on surface colors of the object to be processed W. A feed pipe 38 for purge gas, such as $N_2$ gas, is communicated with the through-hole 34 at a part thereof so that the interior of the through-hole 34 is purged with the inert gas.

A lift mechanism (a boat elevator) 40 is provided below the cooling rod 32 connected to the holder 30. The lift mechanism 40 moves up and down and turns the holder 30 and the cooling rod 32. The mechanism 40 will be detailed later.

The object-to-be-processed loading/unloading unit 50 is provided by an air-tight chamber positioned below the lower opening of the process tube 12, and loads and unloads the object W on and from the holder 30 in an air-tight state with respect to air.

Figure 8:
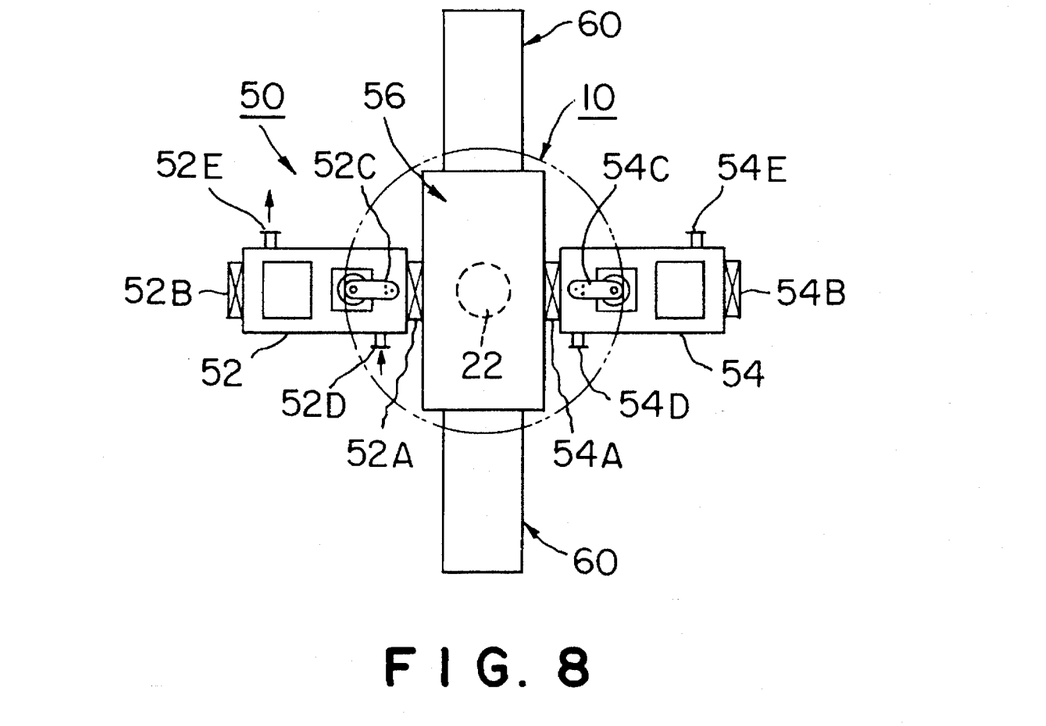
FIG. 8 is a schematic plan view showing the association of the object-to-be-processed loading/unloading unit with the thermal processing apparatus of FIG. 1.

To this end, as shown in FIG. 8, the loading/unloading unit 50 comprises first and second load lock chambers 52, 54, and a delivery chamber 56 (which functions as an air-tight chamber or a load lock chamber) for delivering the object to be processed W from the first and the second load lock chambers 52, 54 to the process tube 12 which is arranged normal to the load lock chambers 52, 54. The first and the second load lock chambers 52, 54 have the same structure.

Here the first load lock chamber 52 will be explained. The first load lock chamber 50 comprises first and second gate valves 52A, 52B, and a retractable, liftable and turnable conveyance arm 52C, a gas feed port 52D and a gas exhaust port 52E. The second load lock chamber 54 comprises a first and a second gate valves 54A, 54B, a retractable, liftable and turnable conveyance arm 54C, a gas feed port 54D and a gas exhaust port 54E.

The gate valves 52A, 52B, 54A, 54B are opened when the object to be processed W is delivered between the outside, and the load lock chambers 52, 54, and between the load lock chambers 52, 54, and the delivery chamber 56, and are closed when the air-tight state is maintained.

The conveyance arm 52C, 54C (the so-called conveyance robots) are provided by, e.g., arms with multi-joints, and convey the object to be processed W from the outside into the load lock chambers 52, 54, or from the load lock chambers 52, 54 to the delivery chamber 56. The gas feed ports 52D, 54D are for purging the load lock chambers 52, 54 with inert gas, such as $N_2$ gas or others. The gas exhaust ports 52E, 54E are for evacuating the load lock chambers 52, 54.

As shown in FIG. 1, the shutter drive unit 60 is provided near the object-to-be-processed loading/unloading unit 50.

As shown in FIG. 1, the shutter drive unit 60 comprises a first shutter 62 and a second shutter 64 both for heat shielding below the lower opening of the process tube 12 along the vertical axis. The first and the second shutters 62, 64 are arranged on both sides of the loading/unloading unit 50 in the vertical axis direction of the thermal processing apparatus 10, and respectively comprise shutter plates 62A, 62B; 64A, 64B which are driven respectively in opposed directions by a rod 66B of the drive means 66, such as hydraulic cylinder or others. The rod 66B is covered by a retractable bellows 66A.

Figure 6:
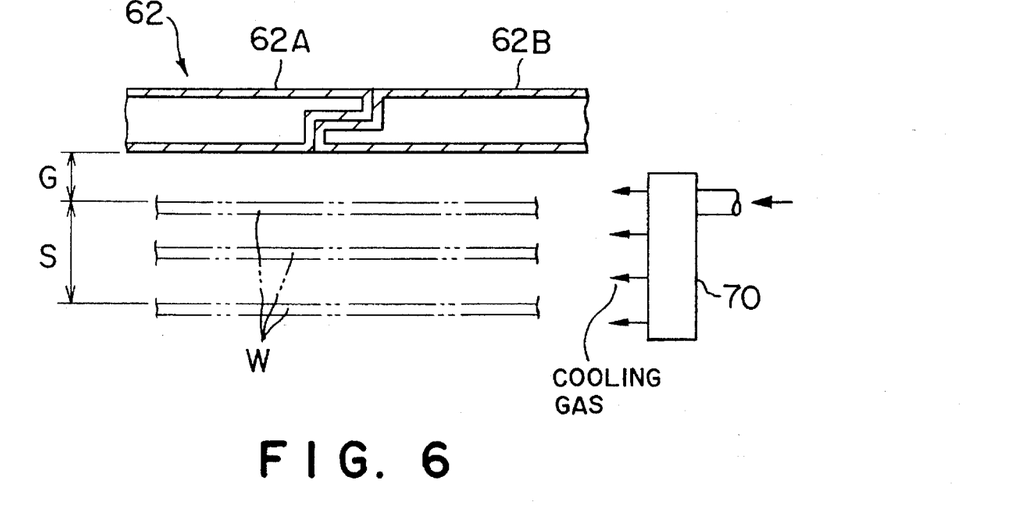
FIG. 6 is a schematic view of one cooling structure of the thermal processing apparatus of FIG. 1.

Each shutter plate 62A, 62B; 64A, 64B has a heat insulating structure with a water cooling jacket formed inside. As shown in FIG. 6, the shutter plates 62A, 62B of the first shutter 62 on the side nearer to the lower opening of the process tube 12 have the opposed surfaces bent in L-section. This arrangement makes the bottom surfaces of the shutter plates 62A, 62B flush with each other when the opposed surfaces are brought into contact with each other so that passage of radiation heat rays from the process tube 12 is prohibited to prevent temperature rises in the air-tight delivery chamber 56 therebelow.

Figure 9A:
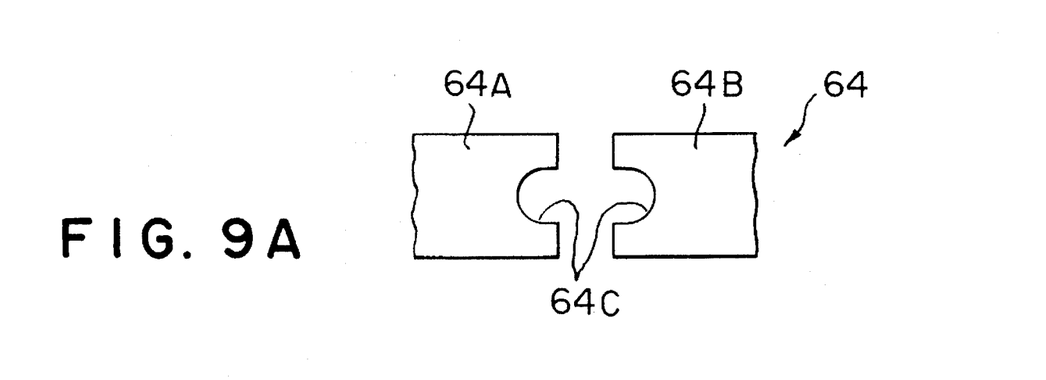
FIGS. 9A and 9B are schematic plan views of one example of the shutter plates of the thermal processing apparatus of FIG. 1, FIG. 9A showing the sate in which the shutter plates are opened, and FIG. 9B showing the state in which the shutter plates are closed.
Figure 9B:
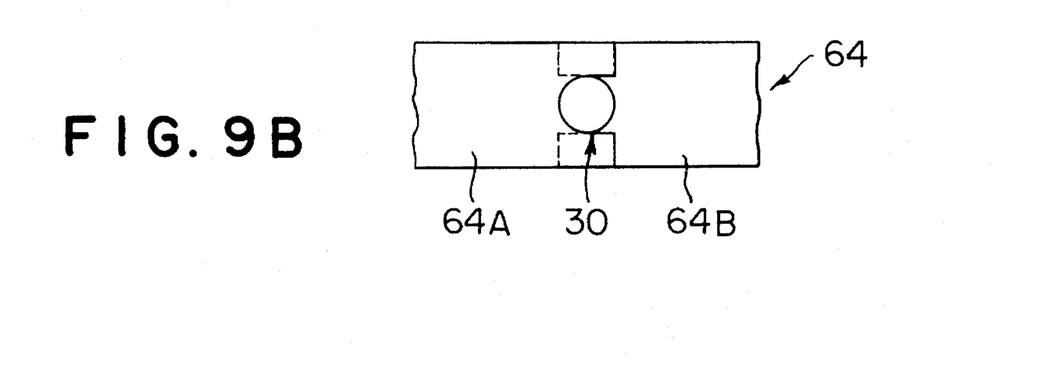

As shown in FIG. 9A, the shutter plates 64A, 64B of the second shutter 64 have recesses 64C formed in the forward ends, which hold the rod portion of the holder 30. As shown in FIG. 9B, the forward ends can overlap each other when the shutter plates 64A, 64B are closed. The shutter plates 64A, 64B can block passage of radiation heat rays from the thermal processing apparatus thereabove when the shutter plates hold the rod portion of the holder 30 in the overlapping state.

In the air-tight delivery chamber 56, in which the first and the second shutter 62, 64 are disposed, there is provided a cooling structure for the object to be processed W.

Figure 10:
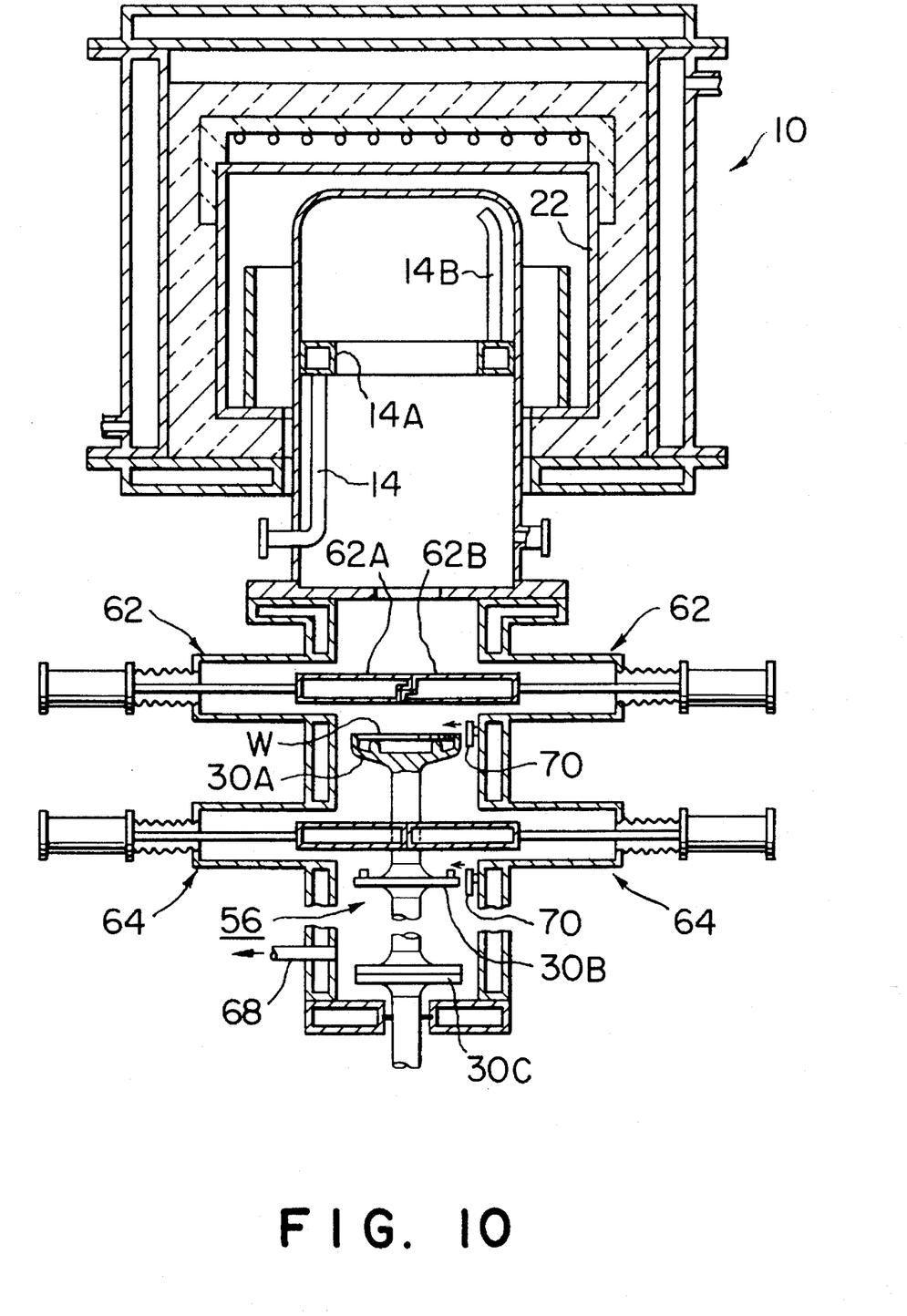
FIG. 10 is a vertical sectional view of the thermal processing apparatus of FIG. 1 in one mode (with both pairs of shutter plates closed).

As shown in FIG. 10, for example, injection nozzles 70 for cooling gas having a number of injection holes are circumferentially equidistantly on the inside of the wall of the air-tight chamber 56 where the holder 30 is retreated lowermost from the thermal processing unit 10. An equal number of exhaust holes 68 to that of the injection nozzles are disposed at circumferentially equidistant positions where the exhaust holes 68 do not interfere with the injection nozzles 70. Each injection nozzle 70 has a number of injection holes for injecting cooling gas horizontally along the vertical axis, and can inject inert gas, such as N2, Ar or others (the so-called gas shower is applied).

The first shutter 62 is used as the cooling structure for the object to be processed W. That is, as shown in FIG. 6, the upper surface of the wafer to be processed W mounted on the holder 30 which has been retreated from the thermal processing unit 10 is placed at a position so as to be near to the underside of the first shutter 62 as much as possible with a distance G between both at minimum, whereby cool air from the water cooling jacket of the shutter 62 is caused to contact the object to be processed W to cool the same. FIG. 6 also shows a plurality of wafers spaced a distance S, apart being subjected to cool air from the water jacket.

The drive mechanism 40 for the holder 30 and the cooling rod 32 have the following structures.

As shown in FIG. 1, the drive mechanism 40 comprises the holder 30, and the lift arm 42 connected to the axial end portion of the cooling rod 32 connected to the holder 30 by the flanges. The lift arm 42 can be moved up and down by an elevator mechanism 44 provided by, e.g., a combination of a ball screw and a nut. For example, a rotary mechanism is provided through a gear in the elevator mechanism 42. The rotary mechanism is controlled by a memory unit 102 and a control device 100 so as to rotate the holder 30 by at least 360° or more when the holder 30 is unloaded from the thermal processing unit 10, and rotate the holder 30 by, e.g., about 60 rpm when the holder 30 is lowered from the thermal processing unit 10 to oppose the object to be processed W to the injection nozzles 70 below the first shutter 62. At this time, the control device 100 controls the elevator mechanism 44 to oscillate up and down at a small stroke with respect to the injection nozzles 70. This operation of the elevator mechanism 44 is for well contacting the cooling gas from the injection nozzles 70 to the surface of the object to be processed W when the holder 30 is set a position (e.g., the retreated position). That is, the object to be processed W is moved up and down so that the cooling gas injected horizontally from the injection holes of the injection nozzles 70 is injected uniformly onto the object to be processed W at a certain diverged angle.

To secure the air tightness when the holder 30 is moved up and down, a seal structure 46 (see FIG. 1) using a magnetic fluid, or a bellows (not shown) is provided between the bottom wall of the air-tight chamber 56 and the outer periphery of the cooling rod 32. The holder 30 may be moved up and down by an independent drive mechanism separate from the elevator mechanism 44.

Figure 7A:
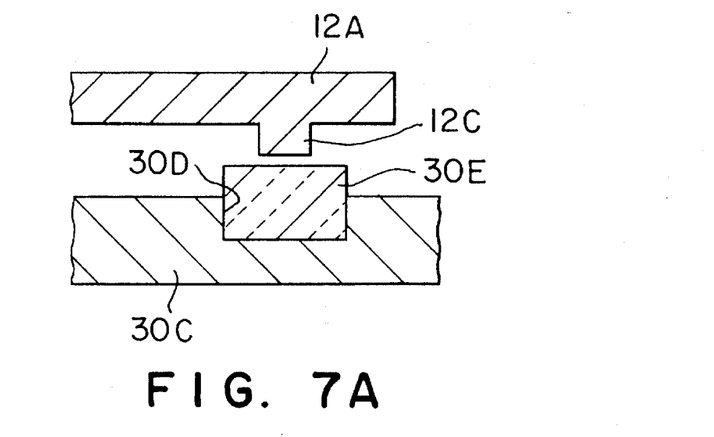
FIGS. 7A and 7B are partially enlarged view of the part X of the thermal processing apparatus of FIG. 1, FIG. 7A showing a state in which the heat shielding member and the lower end flange of the process tube are out of contact with each other, and FIG. 7B showing the heat shielding member and the lower end flange are in complete tight contact with each other.
Figure 7B:
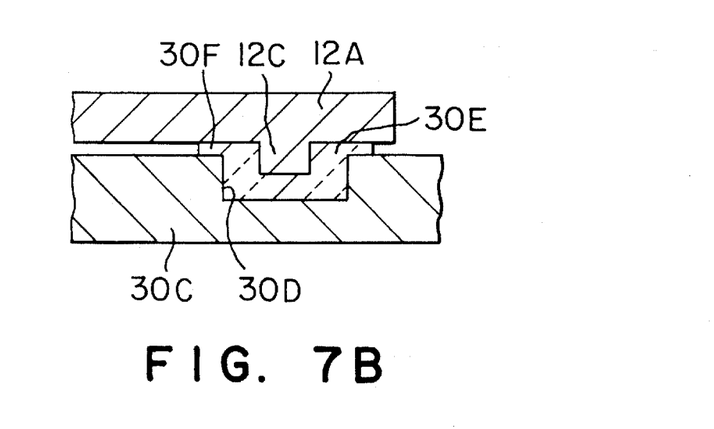

As shown in FIGS. 7A and 7B, a seal is provided between the flange at the flange 12A on the bottom of the process tube 12 and the flange of the shielding member 30C so that heat in the process tube 12 does not intrude into the air-tight chamber 56 below the process tube 12 when the object to be processed W is loaded into the process tube 12. That is, as shown in FIG. 7A, a ring shaped projection 12C is formed on the underside of the flange 12A of the process tube 12. On the other hand, an annular groove 30D associated with the ring shaped projection 12C is formed in the upper surface of the flange of the second shielding member 30C, and a seal member 30E, such as silica cloth, quartz fiber blanket or others, may be inserted in the groove 30E. When the holder 30 is moved up and loaded the object to be processed W at the processing position in the process tube 12 (FIG. 1), the seal member 30E is pressed against the projection 12C of the flange 12A of the process tube 12 with the deformed portion 30F of the seal member 30E sealing between the underside of the flange 12A and the upper surface of the second shielding member 30C, and heat from the process tube 12 is shielded.

The object to be processed W is rotated by a required rotation number during thermal processing. Also when the object to be processed W is being loaded and unloaded, drive control is conducted so that the object to be processed W is moved on more than at least a quarter of a rotation (90°) while the holder 30 is being moved up and down. Such rotation of the object to be processed W upon loading and unloading is for securing homogeneity in one plane of the object W between before and after thermal processing by uniforming supply of radiation heat from the heat source plate 24 and contact with the process gas.

Then, the operation of the thermal processing apparatus according to the present invention will be explained.

When an object to be processed W is thermally processed, first, the objects to be processed W is conveyed into the object-to-be-processed loading/unloading unit 50. Here the explanation will be made with respect to the second load lock chamber 54.

When the object to be processed W is loaded into the thermal processing apparatus 10, the second load lock chamber 54 of FIG. 8 is purged by inert gas, e.g., N2 gas, fed through the gas feed port 54D to preset the interior of the load lock chamber 54 at the same pressure as an outside atmospheric pressure. By placing the interior of the load lock chamber 54 at the same pressure as the outside atmospheric pressure, intrusion and scattering of dust, etc. by abrupt inflows of the gas when the gate valve 54B is opened can be prevented. Then the gate valve 54A is opened to load the object to be processed W is loaded into the delivery chamber (air-tight chamber) by the conveyance arm 54C. Then the gate valve 54B is closed, and the load lock chamber 54 and the delivery chamber 56 are evacuated and purged with N2 gas fed through the gas feed port 54D. At this time, it is preferable that the delivery chamber 56 is beforehand evacuated and purged with N2 gas. It is preferable that the space between the process tube 12, and the first and the second shutters 62, 64 are evacuated and purged with N2 gas to be placed under the same pressure as the interior of the load lock chamber 54.

Figure 11:
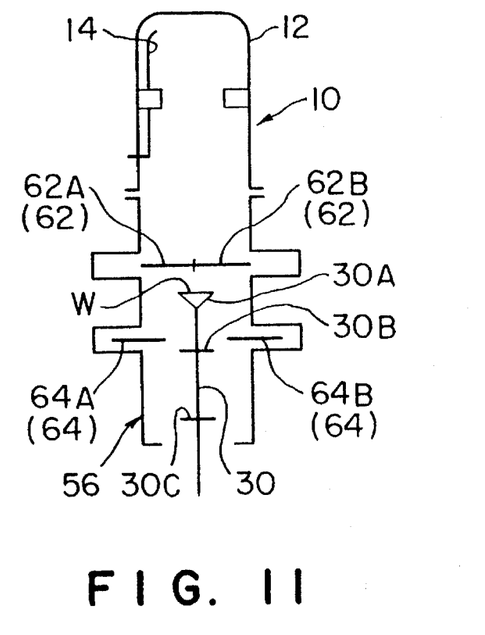
FIG. 11 is a schematic view of one example of the operation of the thermal processing apparatus of FIG. 1.
Figure 12:
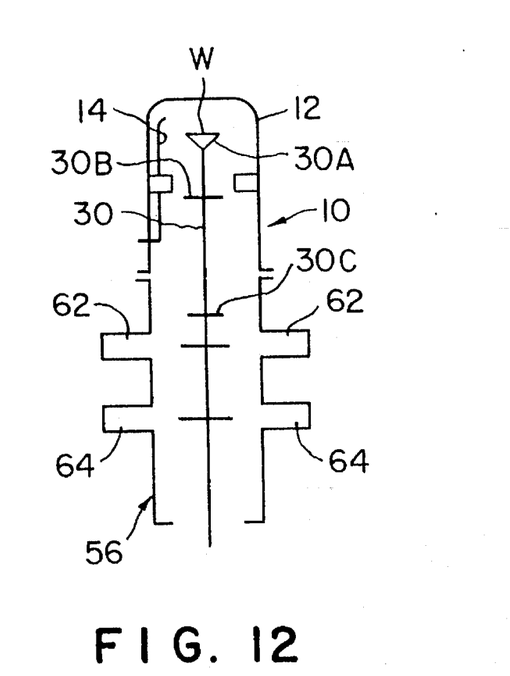
FIG. 12 is a schematic view of a second example of the operation of the thermal processing apparatus of FIG. 1 in which both pairs of shutter plates are opened.

On the other hand, when the object to be processed W is loaded into the delivery chamber 56 by the conveyance arm 54C in the load lock chamber 54, the object to be processed W is delivered onto the holder 30, which has been positioned in the conveying path of the conveyance arm 54C. At this time, as shown in FIG. 11, the second shutter 64 is opened while the first shutter 62 is closed. When the delivery of the object to be processed W onto the holder 30 is over, the holder 30 is started to rotate by the drive mechanism 40. The holder 30 is rotated by, e.g., ¼ rotation (90°) until the holder 30 arrives at a set processing position of the thermal processing unit 10, and stops the rotation when it arrives at the set processing position in the process tube. At this time as shown in FIG. 12, both the first and the second shutters 62, 64 are closed.

The holder 30 which has arrived at the processing position is positioned at a position adjacent to the inside circumferential surface of the preheating portion 14A of the gas feed pipe 14 and started to be rotated at the rotation number for the thermal processing. Then the thermal processing unit 10 is supplied with preheated process gas from the opening 14C of the gas feed pipe 14.

Figure 13:
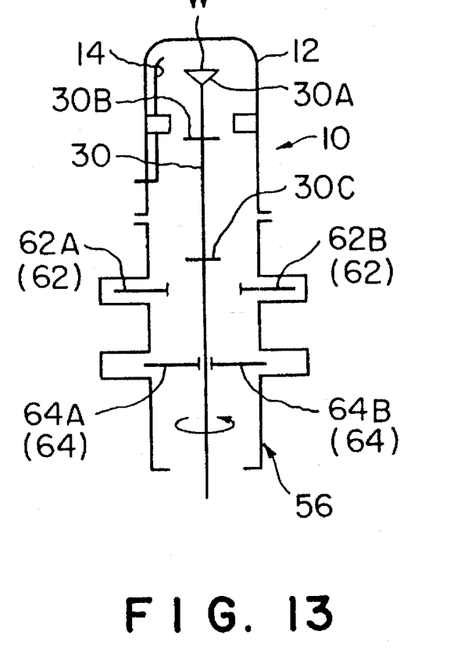
FIG. 13 is a schematic view of a third example of the operation of the thermal processing apparatus of FIG. 1 in which the upper pair of shutter plates are opened, and the lower pair of shutter plates are closed.

When the thermal processing of the object to be processed W is started with the process gas fed, as shown in FIG. 13, the first shutter 62 is opened, and the second shutter 64 is kept closed. Accordingly the shielding member 30B of the holder 30 is positioned so as to cover the lower interior space of the thermal processing unit 10, so that radiation heat rays leaking from the thermal processing unit 10 can be blocked, and in addition the process gas is confined in the thermal processing unit 10 so as to establish thermal processing environments.

Figure 14:
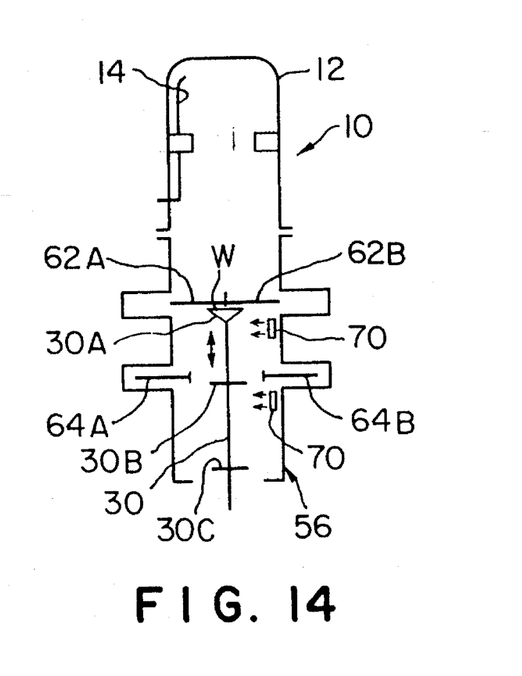
FIG. 14 is a schematic view of a fourth example of the operation of the thermal processing apparatus of FIG. 1 in which the upper pair of shutter plates are closed, and the lower pair of shutter plates are opened.

When the thermal processing is over, as shown in FIG. 14, the holder 30 is so positioned that the mount 30A is positioned below the first shutter 62. At this time the first shielding member 30B of the holder 30 is lowered lest the gas should flow between the preheating portion 14A and the same but so as to cause only convections there. Accordingly the gas which is in contact with the object to be processed W being lowered from the thermal processing unit 10 is not flowing, which allows the object to be processed W to be displaced with minimum heat dissipation from the peripheral parts thereof. Then the holder 30 positioned below the first shutter 62 starts to be rotated at, e.g., a revolution of about 60 rpm at the position where the object to be processed W on the mount 30A is opposed to one of the injection nozzles 70 while being repeatedly moved up and down to cool the object to be processed W in contact with the cooling gas from one of the injection nozzle 70. At this time, the object to be processed W is further cooled by the cooling air from the first shutter 62 positioned above. As shown in FIG. 10, the other injection nozzle 70 is opposed to the shielding member 30B to cool the same.

The object to be processed W thus cooled after the thermal processing is set in the same state as in FIG. 11. Then the object W in this state is displaced from the opposed position to the injection nozzle 70 to the delivery chamber 56 to be conveyed out of the delivery chamber 56 in the proceeding reverse to that for loading.

According to this embodiment, the shutters provided in the air-tight chamber positioned below the lower opening of the process tube can be used as a cooling structure. Accordingly no special structure is necessary, and periods of time for cooling the object to be processed can be reduced.

According to this embodiment, the heat insulating member is provided for surrounding the space below a thermal processing position and between the soaking member and the process tube. Accordingly temperature gradients between the upper surface and the underside of an object to be processed at the processing position can be optimized, so that generation of gas streams due to abrupt changes of a temperature gradient can be prevented, and heat dissipation from the peripheral parts of the object to be processed can be suppressed.

The object-to-be-processed involved in the present invention may be at least plate-shaped, and can be LCDs or others other than semiconductor wafers. The thermal processing apparatus according to the present invention is applicable to, e.g., apparatuses for oxidation, diffusion and annealing other than CVD apparatuses.

The mount of the holder may have a structure which accommodate a plurality of sheets of objects to be processed for thermal processing.

As described above, according to the present invention, the shielding members are provided on the holder for the purposes of shielding heat from a processing position for thermal processing, tight-sealing of process gas and rectifying gas streams generated when an object to be processed is displaced. As results, radiation heat at the processing position is prevented from arriving at regions other than the processing position so as to prohibit thermal troubles. In addition, a temperature gradient at the processing position can be secured, whereby the impairment of homogeneity in one place of an object to be processed by generated gas streams can be precluded.

What is claimed is:

1. A thermal processing apparatus comprising:

a vertical process tube having an opening for loading or unloading an object to be processed at its bottom, and a heat source disposed above the vertical process tube for heating the object to be processed;

a delivery chamber provided underneath the vertical process tube;

an object-to-be-processed holder for holding one sheet of object to be processed in a horizontal orientation to load the same from the delivery chamber into the process tube through the bottom opening and to set the same at a processing position;

gas feed means for feeding reaction gas to the holder at the processing position in the process tube; and a first heat shielding member for blocking heat from escaping from the process tube, said first heat shielding member being disposed on the holder for covering the process tube below the processing position when the holder is set at the processing position in the process tube, said first heat shielding member being dimensioned and arranged such that an atmosphere in the vertical process tube is isolated from the delivery chamber when the bottom opening is closed by said first heat shielding member and such that both the delivery chamber and the vertical process tube have an equal atmosphere when the bottom opening is opened upon a shifting in position of said first heat shielding member, and said first heat shielding member provides thermal insulation between said delivery chamber and said vertical process tube when the holder is set at the processing position by blocking radiation heat originating in said vertical process tube from arriving at said delivery chamber, and said delivery chamber being an air-tight chamber disposed below the bottom opening of the process tube, and said thermal processing apparatus further comprising, a plurality of heat shielding shutters that are disposed for being opened in the air-tight chamber opposed to the bottom opening and disposed vertically offset from each other along a vertical axis of the process tube, and said first heat shielding member being dimensioned and arranged on said holder such that said first heat shielding member is positioned above the shutters positioned nearest to the bottom opening when the holder is at the processing position.

2. The thermal processing apparatus according to claim 1, further comprising rotary means for rotating the holder and said first heat shielding member until the holder arrives at the processing position or until the holder returns from the processing position to a retreated position wherein the holder is positioned for a loading or unloading of the object to be processed into/from the process tube.

3. The thermal processing apparatus according to claim 2, wherein the rotary means includes rotary control means for rotating said holder by a quarter of a rotation until the holder arrives at the processing position or until the holder returns from the processing position to its retreated position wherein the holder is positioned for a loading or an unloading of the object to be processed into or from the process tube.

4. The thermal processing apparatus according to claim 1, further comprising rotary means and rotary control means for rotating the holder and said first heat shielding member when the object to be processed is at the processing position.

5. The thermal processing apparatus according to claim 1, comprising a cooling member disposed in the delivery chamber for opposing the object to be processed when the holder is lowered from the processing position to a retreat position within said delivery chamber.

6. The thermal processing apparatus according to claim 5, wherein the cooling member is provided by a plurality of nozzles for injecting cooling gas disposed on the inside of the wall of the delivery chamber.

7. The thermal processing apparatus as recited in claim 6 further comprising a second heat shielding member vertically spaced between said holder and said first heat shielding member such that said second heat shielding member is subjected to said cooling nozzles.

8. The thermal processing apparatus according to claim 5, comprising means for vertically oscillating the holder while at the retreated position to facilitate cooling of the object by the cooling member.

9. The thermal processing apparatus according to claim 1, wherein a deformable seal member is provided between the underside of a flange on the bottom of the process tube and the upper surface of the first heat shielding member.

10. The thermal processing apparatus according to claim 1, wherein a cooling rod is connected to the lower end of the holder, and a water cooling jacket is positioned inside the cooling rod.

11. The thermal processing apparatus according to claim 1, wherein the heat shielding member formed on the holder is in the form of a plug, and both sides of the plug are defined by a curved, streamlined surface.

12. The thermal processing apparatus according to claim 1, wherein said holder further comprises a second heat shielding member disposed on said holder and vertically spaced between an upper end of said holder and said first heat shielding member such that said second heat shielding member is positioned within said vertical process tube when said holder is at the processing position.

13. The thermal processing apparatus as recited in claim 1, wherein said holder and said first heat shielding member are formed of quartz.

14. A thermal processing apparatus comprising:

a vertical process tube having an opening for loading or unloading an object to be processed at its bottom, and a heat source disposed above said vertical process tube for heating the object to be processed;

a delivery chamber provided underneath the vertical process tube;

an object-to-be-processed holder for holding one sheet of object to be processed in a horizontal orientation to load the same from the delivery chamber into the process tube through the bottom opening and to set the same at a processing position;

gas feed means for feeding reaction gas to the holder at the processing position in the process tube; and a first heat shielding member for blocking heat from escaping from the process tube, said first heat shielding member being disposed on the holder for covering the process tube below the processing position when the holder is set at the processing position in the process tube, said first heat shielding member being dimensioned and arranged such that an atmosphere in the vertical process tube is isolated from the delivery chamber when the bottom opening is closed by said first heat shielding member and such that both the delivery chamber and the vertical process tube have an equal atmosphere when the bottom opening is opened upon a shifting in position of said first heat shielding member, and said first heat shielding member provides thermal insulation between said delivery chamber and said vertical process tube when the holder is set at the processing position by blocking radiation heat originating in said vertical process tube from arriving at said delivery chamber, and wherein said delivery chamber is an air-tight chamber disposed below the bottom opening of the process tube; and said thermal processing apparatus further comprising;

a plurality of heat shielding shutters that are disposed for being opened in the air-tight chamber opposed to the bottom opening and disposed vertically offset from each other along a vertical axis of the process tube; and a second heat shielding member disposed on the holder in addition to said first heat shielding member, and the first heat shielding member being dimensioned and arranged on said holder such that said first heat shielding member is positioned above the shutters positioned nearest to the bottom opening when the holder is at the processing position.

15. A thermal processing apparatus comprising:

a vertical process tube having an opening for loading or unloading an object to be processed at its bottom; and a heat source disposed above said vertical process tube for heating the object to be processed;

a delivery chamber provided underneath the vertical process tube;

an object-to-be-processed holder for holding one sheet of object to be processed in a horizontal orientation to load the same from the delivery chamber into the process tube through the bottom opening and to set the same at a processing position;

gas feed means for feeding reaction gas to the holder at the processing position in the process tube; and a first heat shielding member for blocking heat from escaping from the process tube, said first heat shielding member being disposed on the holder for covering the process tube below the processing position when the holder is set at the processing position in the process tube, said first heat shielding member being dimensioned and arranged such that an atmosphere in the vertical process tube is isolated from the delivery chamber when the bottom opening is closed by said first heat shielding member and such that both the delivery chamber and the vertical process tube have an equal atmosphere when the bottom opening is opened upon a shifting in position of said first heat shielding member, and said first heat shielding member provides thermal insulation between said delivery chamber and said vertical process tube when the holder is set at the processing position by blocking radiation heat originating in said vertical process tube from arriving at said delivery chamber, and said apparatus further comprising heat shielding shutters which include shutter plates that are positioned within said delivery chamber and are horizontally opposed and movable between a closed position and an open position, and said shutter plates having the opposed surfaces bent in L-section.

16. A thermal processing apparatus comprising:

a vertical process tube having an opening for loading or unloading an object to be processed at its bottom, and a heat source disposed above said vertical process tube for heating the object to be processed;

a delivery chamber provided underneath the vertical process tube;

an object-to-be-processed holder for holding one sheet of object to be processed in a horizontal orientation to load the same from the delivery chamber into the process tube through the bottom opening and to set the same at a processing position;

gas feed means for feeding reaction gas to the holder at the processing position in the process tube; and a first heat shielding member for blocking heat from escaping from the process tube, said first heat shielding member being disposed on the holder for covering the process tube below the processing position when the holder is set at the processing position in the process tube, said first heat shielding member being dimensioned and arranged such that an atmosphere in the vertical process tube is isolated from the delivery chamber when the bottom opening is closed by said first heat shielding member and such that both the delivery chamber and the vertical process tube have an equal atmosphere when the bottom opening is opened upon a shifting in position of said first heat shielding member, and said first heat shielding member provides thermal insulation between said delivery chamber and said vertical process tube when the holder is set at the processing position by blocking radiation heat originating in said vertical process tube from arriving at said delivery chamber, and said thermal processing apparatus further comprising a cooling member disposed in the delivery chamber for opposing the object to be processed when the holder is lowered from the processing position to a retreat position within said delivery chamber, and wherein the cooling member is provided by a water cooling jacket formed inside heat shielding shutters which are opposed to a processed surface of the processed object when the holder is lowered to the retreated position.

17. A thermal processing apparatus comprising:

a vertical process tube having in the bottom an opening for an object to be processed to be loaded or unloaded through, and a heat source disposed above the vertical process tube for heating the object to be processed;

an object-to-be-processed holder having a mount for loading the object to be processed in a horizontal orientation to load the same through the bottom opening into the process tube and set the same at a processing position;

gas feed means for feeding reaction gas to the holder at the processing position in the process tube; and a first heat shielding member for blocking heat from escaping from the process tube disposed on the holder for covering the process tube below the processing position when the holder is set at the processing position, and wherein said first heat shielding member thermally insulates said vertical process tube by blocking radiation heat originating in said vertical process tube from escaping out through the opening at the bottom of the process tube, said thermal processing apparatus further comprising a second heat shielding member disposed on said holder and vertically spaced between said mount and said first heat shielding member such that said second heat shielding member is positioned within said vertical process tube when said holder is at the processing position and said mount, first heat shielding member and said second heat shielding member are formed of a common material and as integral components of said holder.

18. The thermal processing apparatus according to claim 17, wherein the gas feed means includes a gas feed line preheating member which is positioned upstream from an outlet opening of said gas feed line.

19. The thermal processing apparatus according to claim 18, wherein said preheating member has an inside surface defining an annular void.

20. The thermal processing apparatus according to claim 19, wherein said heat radiation fins are provided at an interval in the annular void of said preheating member.

21. The thermal processing apparatus as recited in claim 17, wherein said mount and said first heat shielding member represent a single, integral unit commonly formed of a quartz material.

22. A thermal processing apparatus comprising:

a vertical process tube having in the bottom an opening for an object to be processed to be loaded or unloaded through, and a heat source disposed above the vertical process tube for heating the object to be processed;

an object-to-be-processed holder having a mount for loading the object to be processed in a horizontal orientation;

an elevator assembly for lifting and lowering said holder through the bottom opening into the process tube and to set the mount at a processing position;

gas feed means for feeding reaction gas to the mount while at the processing position in the process tube; and a first heat shielding member for blocking heat from the process tube, said first heat shielding member being joined with the holder and being positioned on said holder for covering the process tube below the processing position when the holder is set at the processing position;

a rotation assembly which rotates both said holder and said first heat shielding member joined with said holder about a vertical axis, and said thermal processing apparatus further comprising a second heat shielding member which is joined with said holder so as to rotate with said holder when said holder is rotated by said rotation assembly, and wherein said second heat shielding member is positioned between said mount and said first heat shielding member and includes curved upper and lower surfaces so as to provide streamlined upper and lower surfaces.

23. The thermal processing apparatus of claim 22 wherein said mount and said first heat shielding member are formed as a single, integral unit of a common material, which material is quartz.

24. The thermal processing apparatus of claim 22 further comprising a second heat shielding member and a pre-heater, said second heat shielding member being joined to said holder between said mount and said first heat shielding member, said pre-heater being an annular member with an annular void formed therein and said annular member being positioned in line with said gas feed means and within the vertical process tube, and said second heat shielding member being dimensioned and arranged so as to define a gap between said second heat shielding member and said annular member when said mount is in the processing position.

* * * * *